US012736487B2

(12) United States Patent
Nakamura et al.

(10) Patent No.: US 12,736,487 B2
(45) Date of Patent: Sep. 15, 2026

(54) INSPECTION SYSTEM

(71) Applicant: Hitachi High-Tech Corporation, Tokyo (JP)

(72) Inventors: Yohei Nakamura, Tokyo (JP); Naoko Takeda, Tokyo (JP); Natsuki Tsuno, Tokyo (JP); Satoshi Takada, Tokyo (JP); Heita Kimizuka, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 354 days.

(21) Appl. No.: 18/282,624

(22) PCT Filed: Mar. 29, 2021

(86) PCT No.: PCT/JP2021/013189
§ 371 (c)(1),
(2) Date: Sep. 18, 2023

(87) PCT Pub. No.: WO2022/208572
PCT Pub. Date: Oct. 6, 2022

(65) Prior Publication Data

US 2024/0151665 A1 May 9, 2024

(51) Int. Cl.
*H01J 37/26* (2006.01)
*G01N 23/2251* (2018.01)

(52) U.S. Cl.
CPC ........ *G01N 23/2251* (2013.01); *H01J 37/265* (2013.01); *G01N 2223/6116* (2013.01);
(Continued)

(58) Field of Classification Search
CPC .. H01J 37/00; H01J 37/02; H01J 37/22; H01J 37/244; H01J 37/28; H01J 37/3026;
(Continued)

(56) References Cited

U.S. PATENT DOCUMENTS 5,160,884 A 11/1992 Todokoro et al.
5,260,648 A 11/1993 Brust
(Continued)

FOREIGN PATENT DOCUMENTS

JP S58-197643 A 11/1983
JP S62-223960 A 10/1987
(Continued)

OTHER PUBLICATIONS

Search Report mailed May 18, 2021 in International Application No. PCT/JP2021/013189.
(Continued)

*Primary Examiner* — Jason L Mccormack
(74) *Attorney, Agent, or Firm* — Miles & Stockbridge, P.C.

(57) ABSTRACT

Provided is an inspection system capable of estimating electric characteristics of a sample with high accuracy regardless of an initial charging state of a wafer. The inspection system includes a charged particle beam device and a computer system, and inspects the electric characteristics of the sample. The inspection system evaluates initial charging of an inspection region including inspection patterns based on reference data indicating a secondary charged particle signal from a reference pattern corresponding to a plurality of pulse conditions. The reference pattern has the same electric characteristics as the inspection pattern and initial charging therein caused by electric charges that are not emitted according to a discharge time constant of the sample is negligible. The reference pattern is obtained by irradiating the reference pattern with a pulse charged particle beam under a plurality of pulse conditions.

9 Claims, 14 Drawing Sheets

(52) U.S. Cl.
CPC ................ *H01J 2237/24564* (2013.01); *H01J 2237/2806* (2013.01)

(58) Field of Classification Search
CPC ........... H01J 37/265; H01J 2237/24564; H01J 2237/2806; G01N 23/2251; G01N 2223/6116
USPC .......................................... 250/306, 307, 311
See application file for complete search history.

(56) References Cited

U.S. PATENT DOCUMENTS

| | | | | |
|---|---|---|---|---|
| 7,123,330 | B2 | 10/2006 | Kondoh | |
| 7,830,341 | B2 | 11/2010 | Hiroshi et al. | |
| 7,943,533 | B2 | 5/2011 | Mizuno | |
| 8,673,428 | B2 | 3/2014 | Naoyuki et al. | |
| 8,841,612 | B2 | 9/2014 | Fukuda et al. | |
| 8,907,279 | B2 | 12/2014 | Tsuno et al. | |
| 9,236,220 | B2 | 1/2016 | Tsuno et al. | |
| 9,443,694 | B2 | 9/2016 | Konishi et al. | |
| 9,659,744 | B2 | 5/2017 | Tsuno et al. | |
| 9,978,558 | B2 | 5/2018 | Shimizu et al. | |
| 9,991,092 | B2 | 6/2018 | Cheng et al. | |
| 10,020,163 | B2 | 7/2018 | Konishi et al. | |
| 11,043,358 | B2 | 6/2021 | Araki et al. | |
| 2003/0057971 | A1 | 3/2003 | Nishiyama et al. | |
| 2003/0094572 | A1 | 5/2003 | Matsui et al. | |
| 2003/0193026 | A1 | 10/2003 | Takagi | |
| 2004/0026633 | A1 | 2/2004 | Gunji et al. | |
| 2005/0045820 | A1 | 3/2005 | Ohshima et al. | |
| 2007/0040118 | A1 | 2/2007 | Cheng et al. | |
| 2007/0221844 | A1* | 9/2007 | Yamanashi | H01J 37/026 250/309 |
| 2007/0228276 | A1 | 10/2007 | Makino et al. | |
| 2008/0116375 | A1 | 5/2008 | Ikegami et al. | |
| 2009/0179151 | A1 | 7/2009 | Cheng et al. | |
| 2012/0074316 | A1* | 3/2012 | Watanabe | H01J 37/29 250/307 |
| 2012/0292506 | A1 | 11/2012 | Tsuno et al. | |
| 2013/0126733 | A1 | 5/2013 | Fukuda et al. | |
| 2014/0097342 | A1 | 4/2014 | Tsuno et al. | |
| 2015/0041644 | A1 | 2/2015 | Tsuno et al. | |
| 2016/0148781 | A1* | 5/2016 | Tsuno | G01N 23/00 250/307 |
| 2020/0111638 | A1 | 4/2020 | Araki et al. | |
| 2023/0377837 | A1* | 11/2023 | Nakamura | H01J 37/22 |

FOREIGN PATENT DOCUMENTS

| | | | |
|---|---|---|---|
| JP | S63-001040 | A | 1/1988 |
| JP | H02-295043 | A | 12/1990 |
| JP | 1999-111599 | A | 4/1999 |
| JP | 2001-338603 | A | 12/2001 |
| JP | 2003-100823 | A | 4/2003 |
| JP | 2003-151483 | A | 5/2003 |
| JP | 2003-003566 | A | 10/2003 |
| JP | 2003-031768 | A | 11/2003 |
| JP | 2004-031379 | A | 1/2004 |
| JP | 2005-071775 | A | 3/2005 |
| JP | 2007-053035 | A | 3/2007 |
| JP | 2007-265931 | A | 10/2007 |
| JP | 2008-123716 | A | 5/2008 |
| JP | 2012-252913 | A | 12/2012 |
| JP | 2013-033739 | A | 2/2013 |
| JP | 2013-214467 | A | 10/2013 |
| JP | 2016-100153 | A | 5/2016 |
| JP | 2018-137160 | A | 8/2018 |
| WO | 2011058950 | A1 | 5/2011 |

OTHER PUBLICATIONS

Written Opinion mailed May 18, 2021 in International Application No. PCT/JP2021/013189.
Notice of Allowance mailed Feb. 24, 2021 in U.S. Appl. No. 16/486,422.
Office Action mailed Aug. 23, 2016 in U.S. Appl. No. 14/948,167.
Notice of Allowance mailed Jan. 18, 2017 in U.S. Appl. No. 14/948,167.
Office Action mailed Oct. 1, 2020 in U.S. Appl. No. 16/486,422.
Search Report mailed Aug. 8, 2017 in International Application No. PCT/JP2017/017993.
Written Opinion mailed Aug. 8, 2017 in International Application No. PCT/JP2017/017993.
W.K. Wong et al.; "Charging Control Using Pulsed Scanning Electron Microscopy", Scanning, vol. 17, pp. 312-315 (1995).
S. Gorlich et al.; "Capacitive Coupling Voltage Contrast", Scanning Electron Microscopy, vol. II, pp. 447-464 (1986).

* cited by examiner

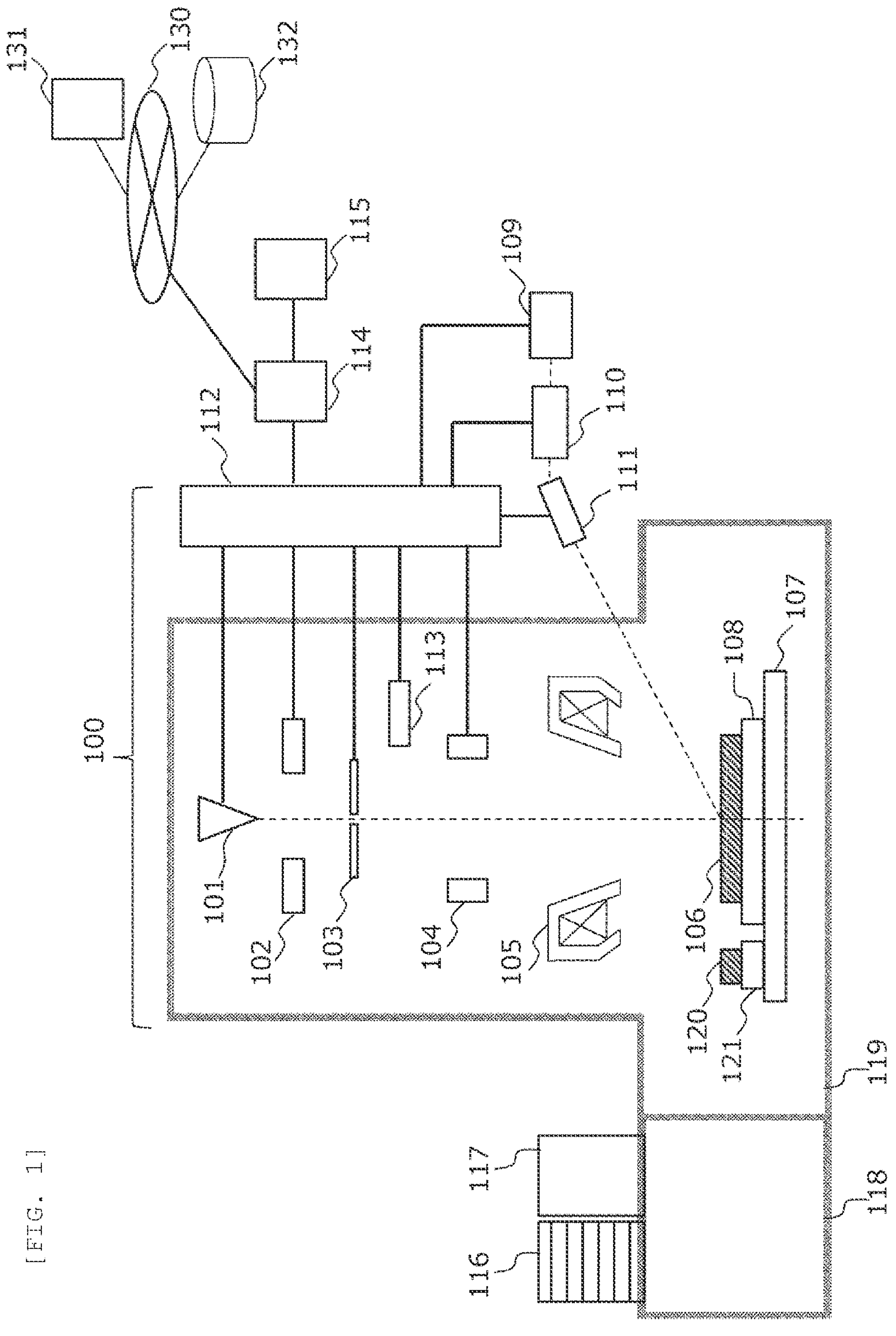
[FIG. 1]
100
101
102
103
104
105
106
107
108
109
110
111
112
113
114
115
116
117
118
119
120
121
130
131
132

[FIG. 2A]
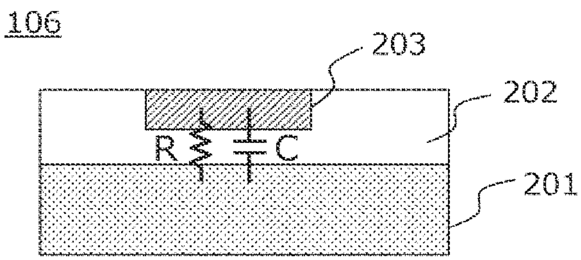
[FIG. 2B]
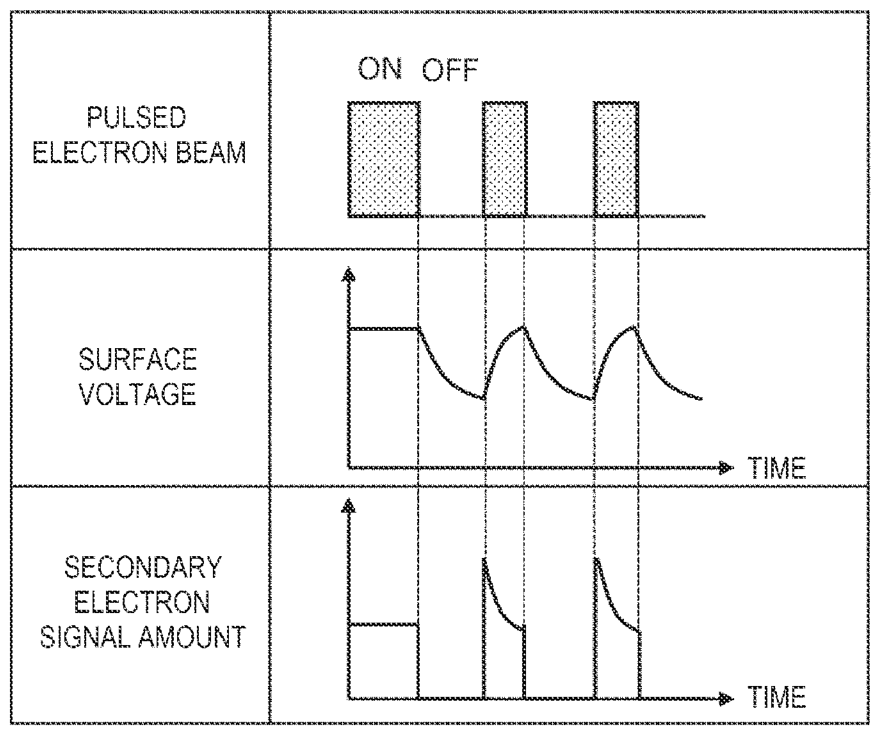

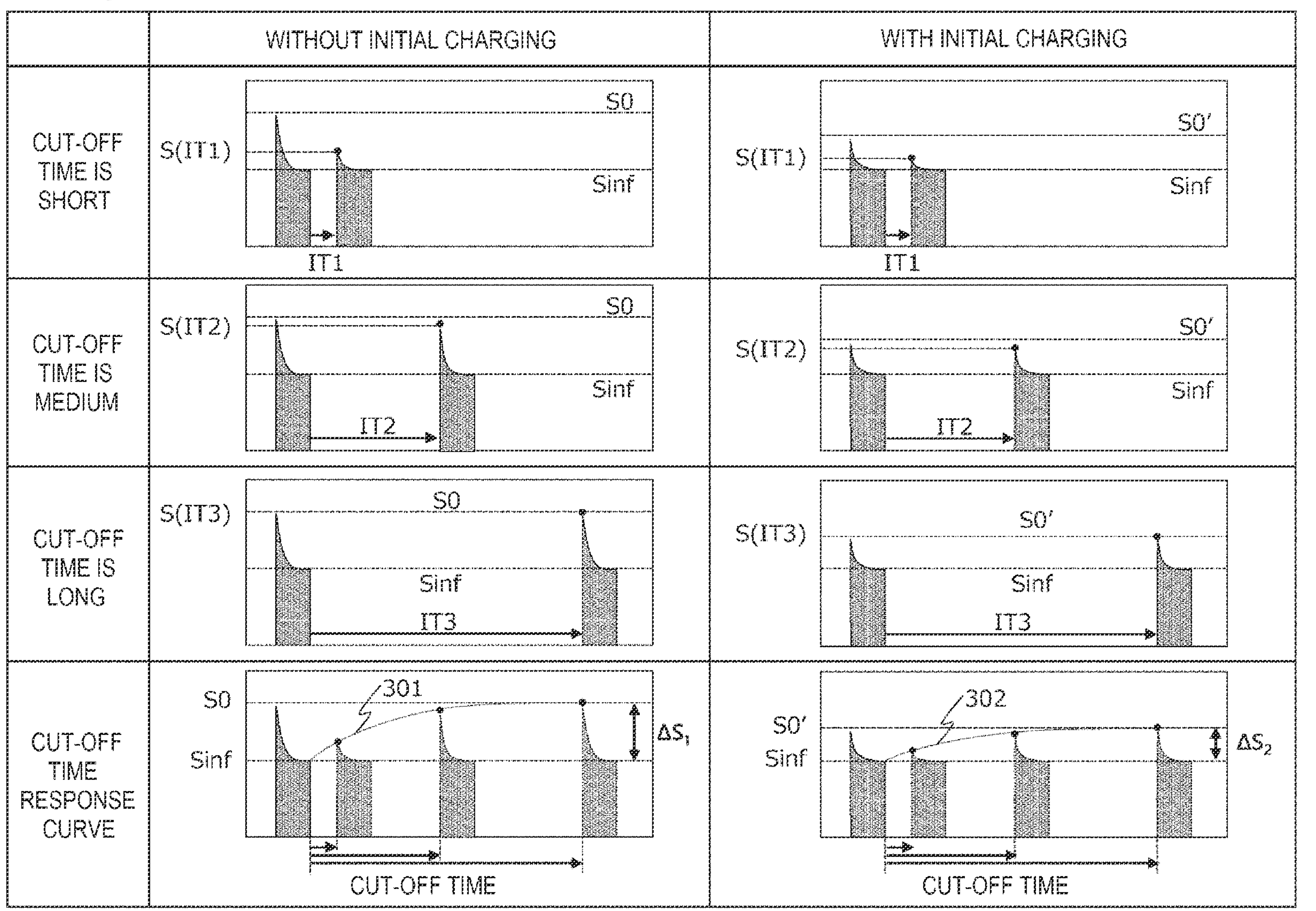
[FIG. 3A]
WITHOUT INITIAL CHARGING
WITH INITIAL CHARGING
CUT-OFF TIME IS SHORT
CUT-OFF TIME IS MEDIUM
CUT-OFF TIME IS LONG
CUT-OFF TIME RESPONSE CURVE
S(IT1)
S(IT2)
S(IT3)
S0
S0'
Sinf
IT1
IT2
IT3
301
302
CUT-OFF TIME
$\Delta S_1$
$\Delta S_2$

[FIG. 3B]
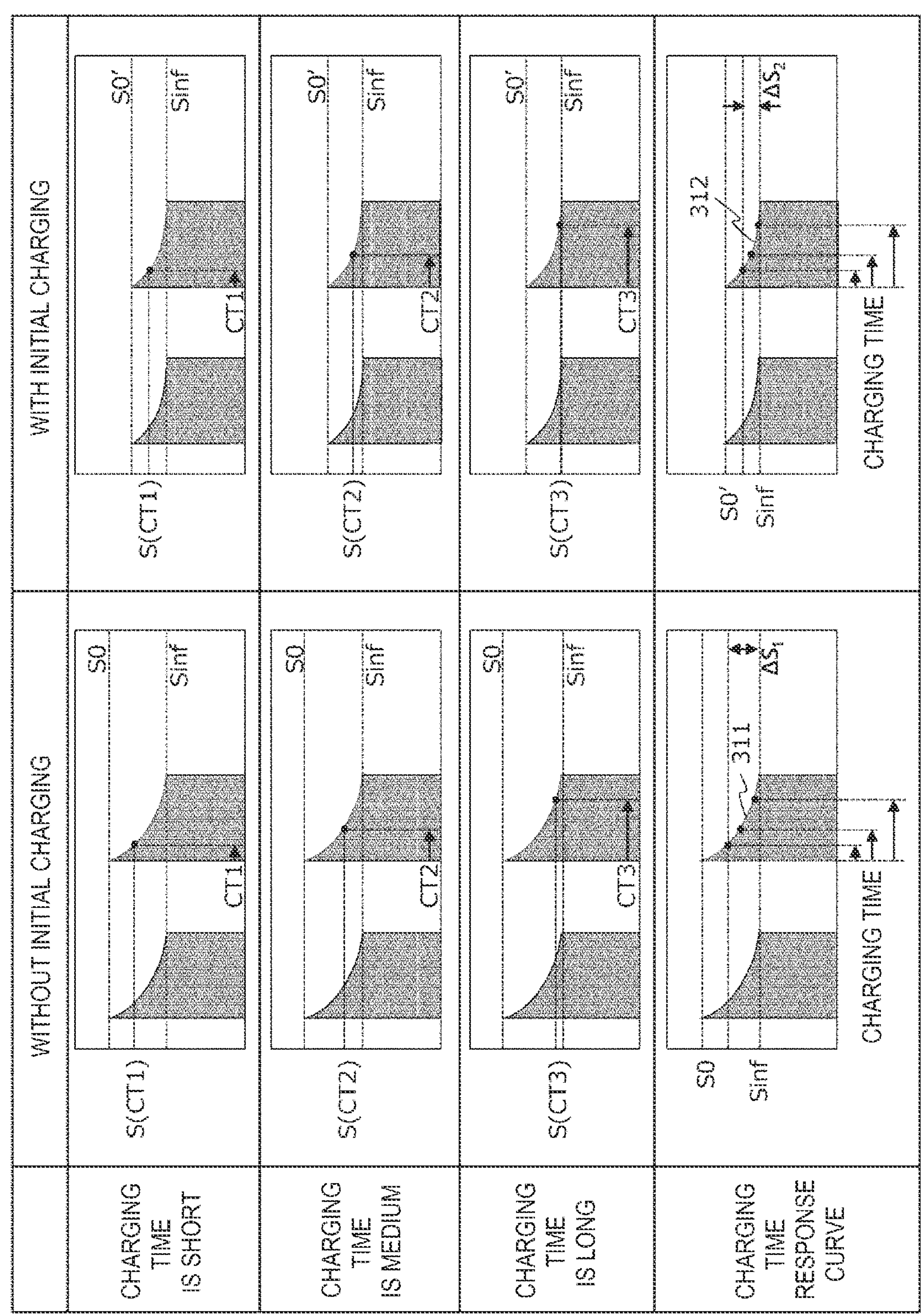

[FIG. 4]
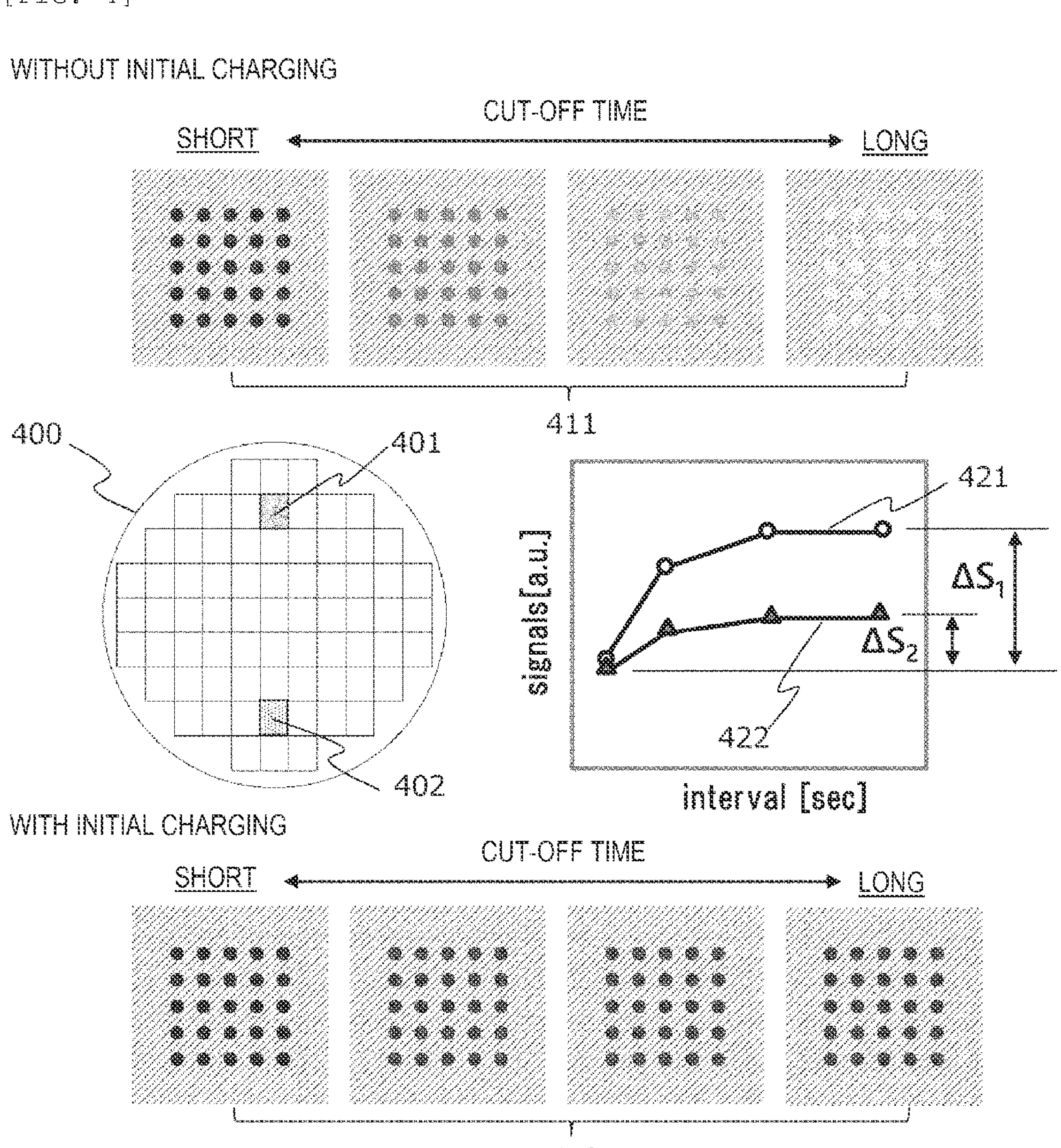

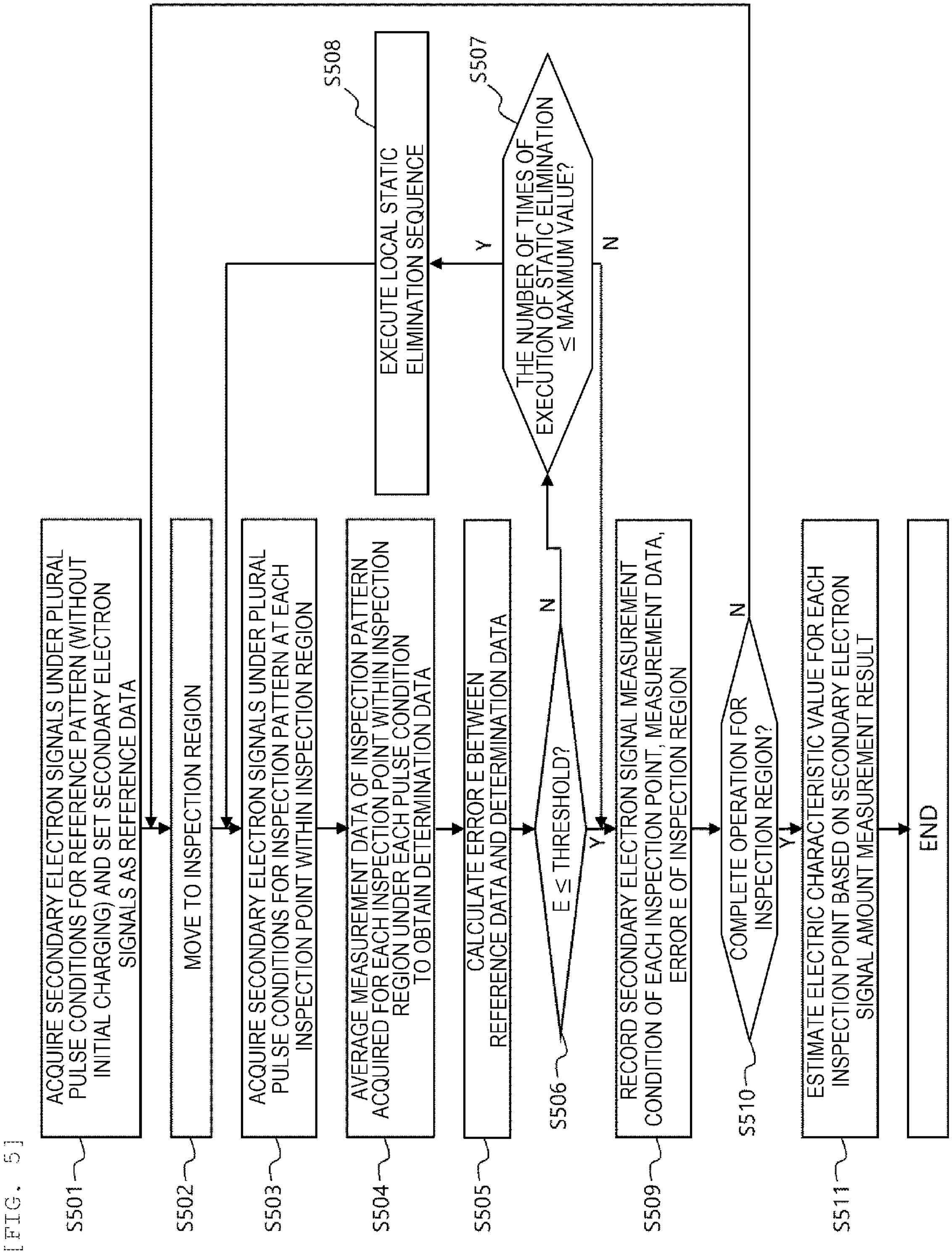
[FIG. 5]
S501
ACQUIRE SECONDARY ELECTRON SIGNALS UNDER PLURAL PULSE CONDITIONS FOR REFERENCE PATTERN (WITHOUT INITIAL CHARGING) AND SET SECONDARY ELECTRON SIGNALS AS REFERENCE DATA
S502
MOVE TO INSPECTION REGION
S503
ACQUIRE SECONDARY ELECTRON SIGNALS UNDER PLURAL PULSE CONDITIONS FOR INSPECTION PATTERN AT EACH INSPECTION POINT WITHIN INSPECTION REGION
S504
AVERAGE MEASUREMENT DATA OF INSPECTION PATTERN ACQUIRED FOR EACH INSPECTION POINT WITHIN INSPECTION REGION UNDER EACH PULSE CONDITION TO OBTAIN DETERMINATION DATA
S505
CALCULATE ERROR E BETWEEN REFERENCE DATA AND DETERMINATION DATA
S506
E ≤ THRESHOLD?
Y
N
S507
THE NUMBER OF TIMES OF EXECUTION OF STATIC ELIMINATION ≤ MAXIMUM VALUE?
Y
N
S508
EXECUTE LOCAL STATIC ELIMINATION SEQUENCE
S509
RECORD SECONDARY ELECTRON SIGNAL MEASUREMENT CONDITION OF EACH INSPECTION POINT, MEASUREMENT DATA, ERROR E OF INSPECTION REGION
S510
COMPLETE OPERATION FOR INSPECTION REGION?
Y
N
S511
ESTIMATE ELECTRIC CHARACTERISTIC VALUE FOR EACH INSPECTION POINT BASED ON SECONDARY ELECTRON SIGNAL AMOUNT MEASUREMENT RESULT
END

[FIG. 6]

| REGION NUMBER | INSPECTION POINT NUMBER | PULSE CONDITION | MEASUREMENT DATA S (p, ITi) | ELECTRIC CHARACTERISTIC INDEX 1 | ELECTRIC CHARACTERISTIC INDEX 2 | INITIAL CHARGING ERROR | INITIAL CHARGING DETERMINATION | THE NUMBER OF TIMES OF EXECUTION OF STATIC ELIMINATION |
|---|---|---|---|---|---|---|---|---|
| G1 | P1 | IT1 | S(1, IT1) | R1 | C1 | E(G1) | OK | 2 |
| | | IT2 | S(1, IT2) | | | | | |
| | | IT3 | S(1,IT3) | | | | | |
| | P2 | IT1 | S(2, IT1) | R2 | C2 | | | |
| | | IT2 | S(2, IT2) | | | | | |
| | | IT3 | S(2, IT3) | | | | | |
| | P3 | IT1 | S(3, IT1) | R3 | C3 | | | |
| | | IT2 | S(3, IT2) | | | | | |
| | | IT3 | S(3, IT3) | | | | | |
| G2 | P4 | IT1 | S(4, IT1) | error | error | E(G2) | NG | 3 |

[FIG. 7A]
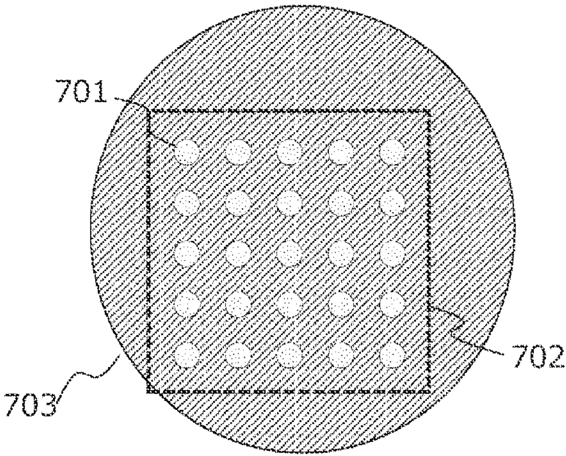
[FIG. 7B]
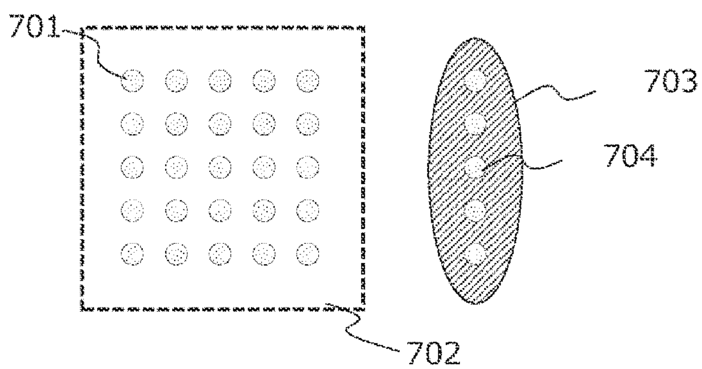
[FIG. 7C]
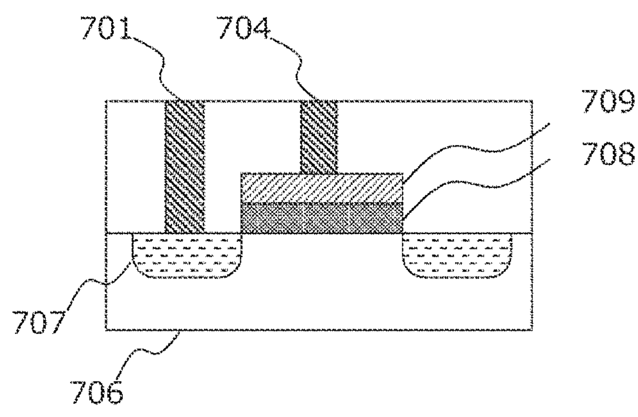

[FIG. 7D]
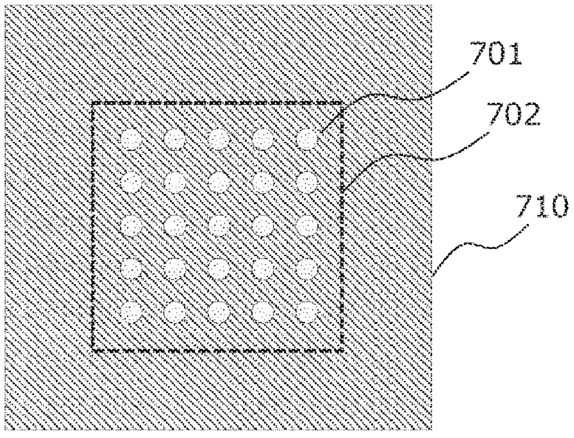
[FIG. 8]
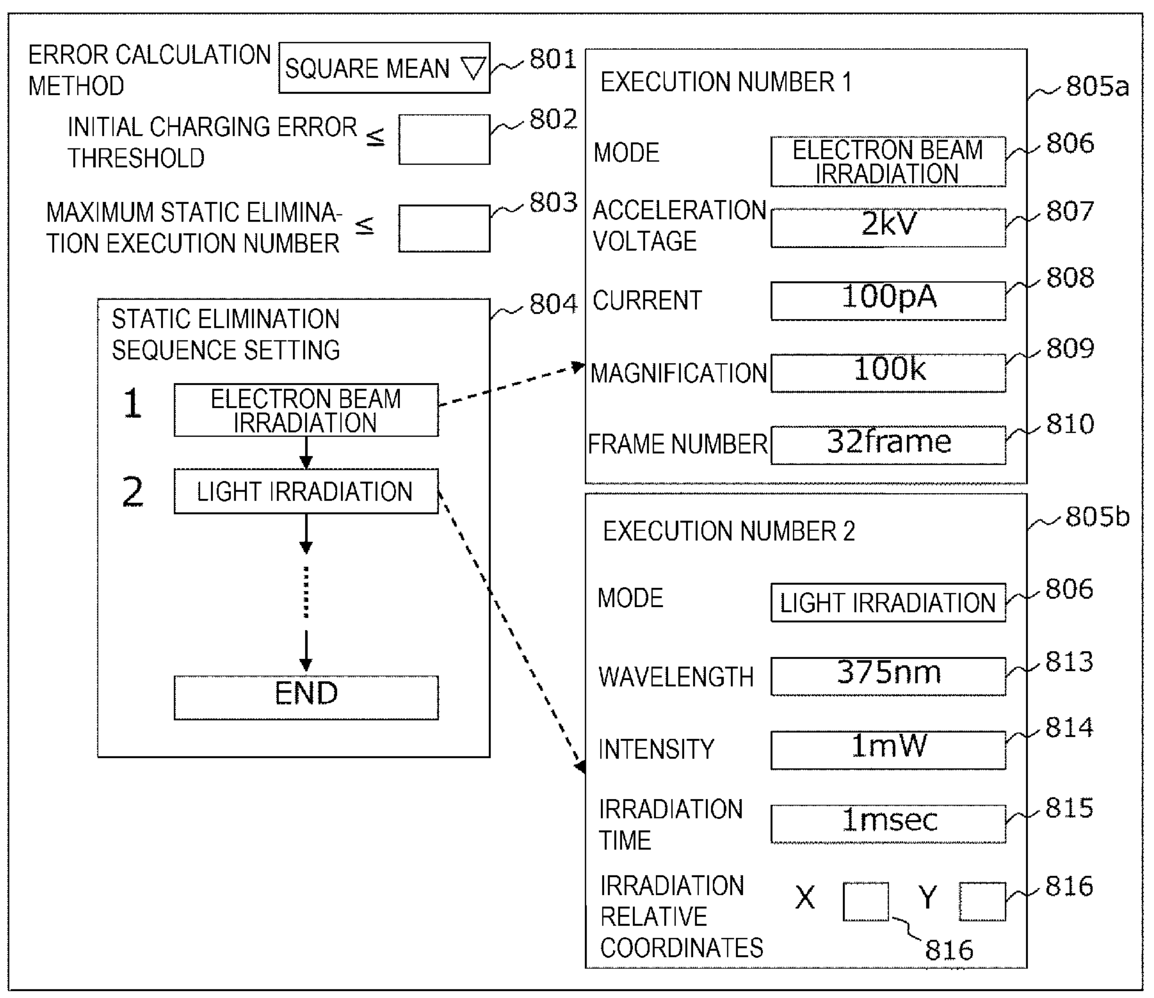

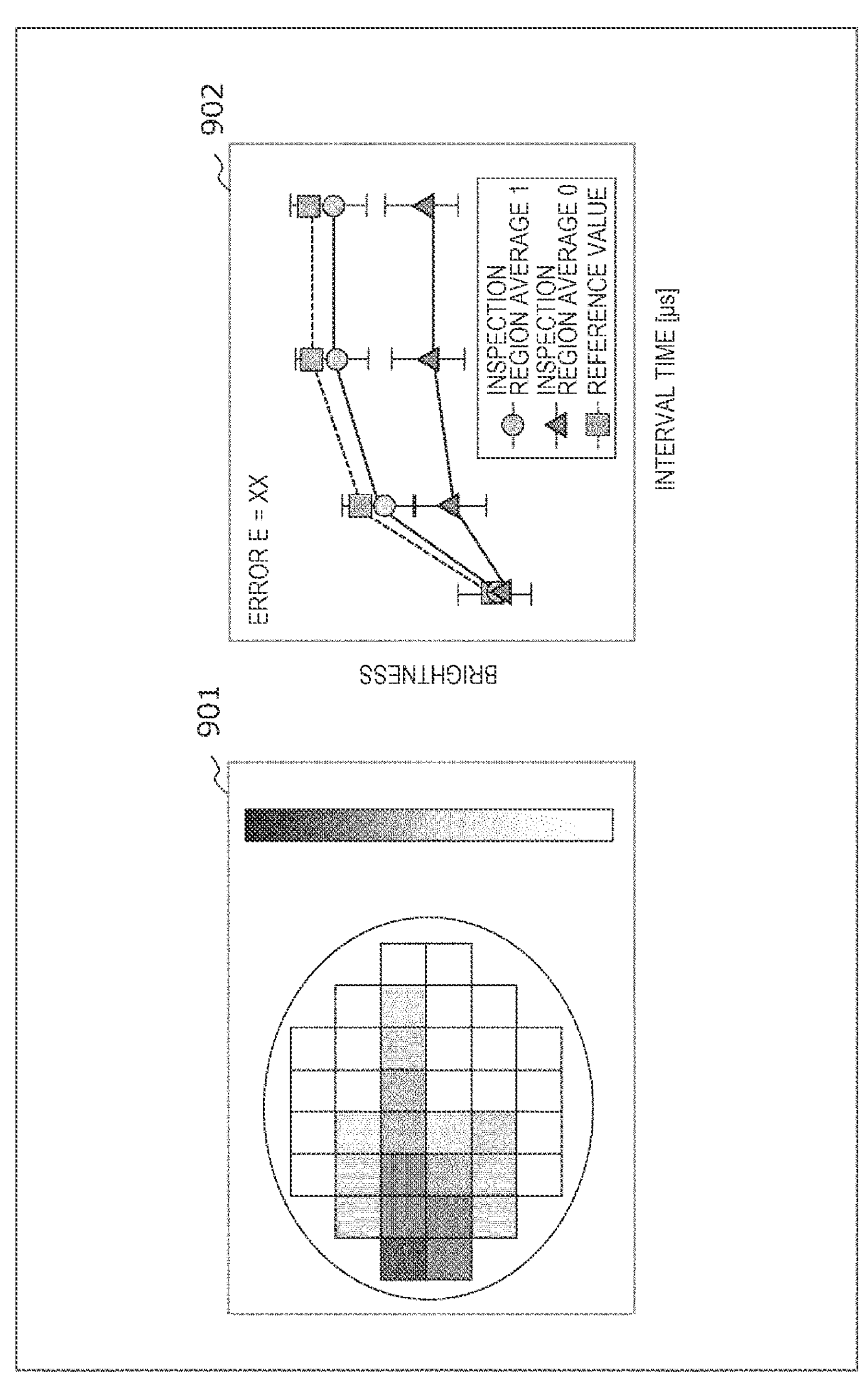
[FIG. 9]

[FIG. 10]
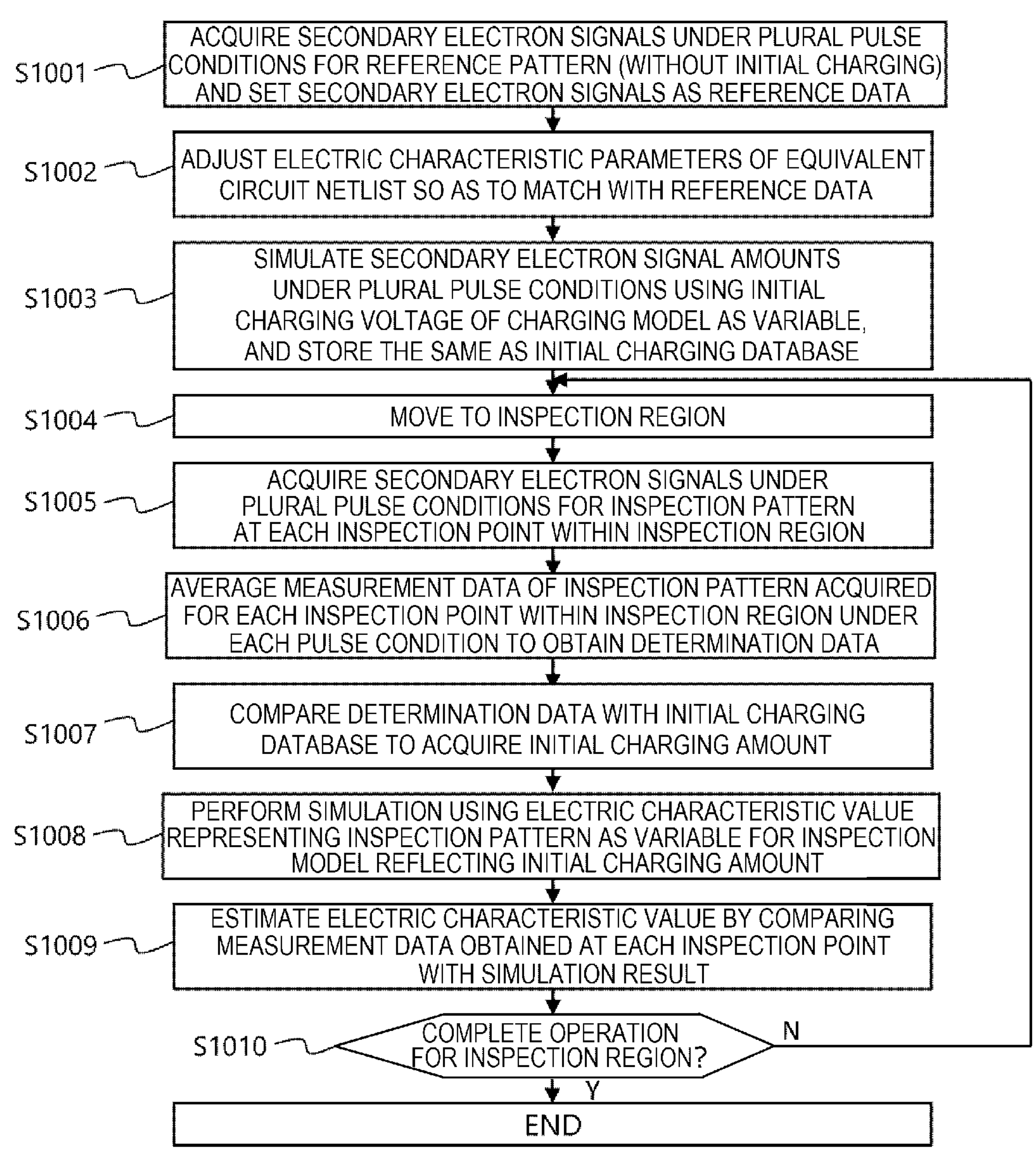

[FIG. 11A]
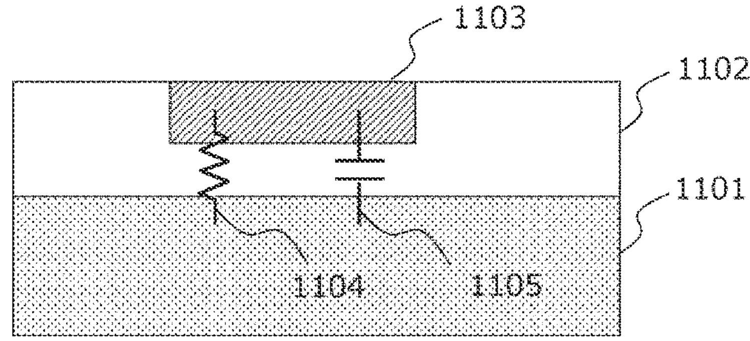
[FIG. 11B]
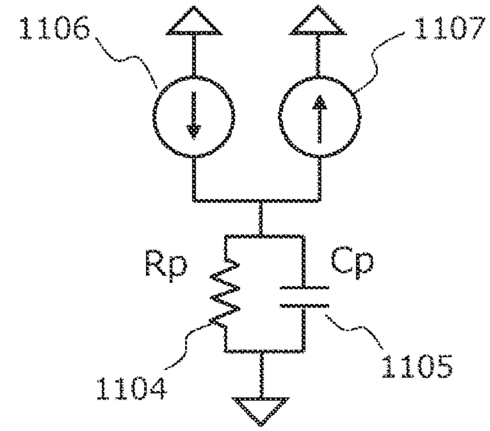
[FIG. 12A]
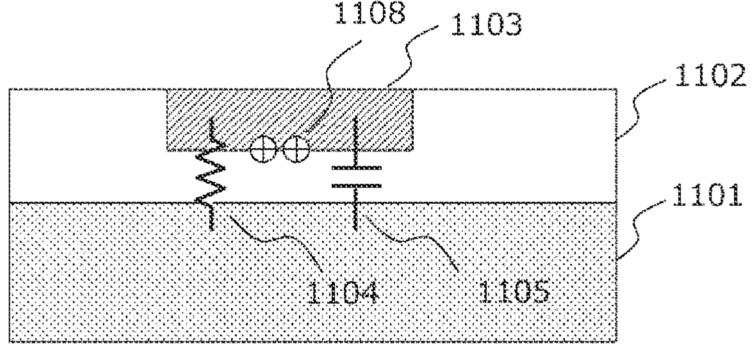

[FIG. 12B]
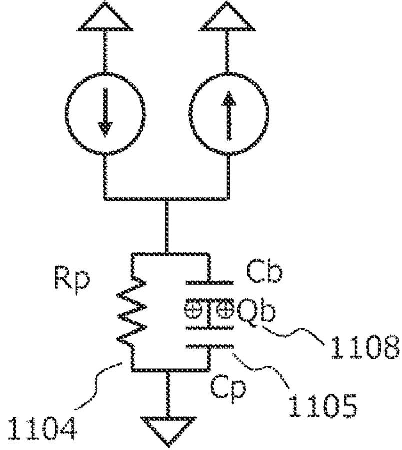
[FIG. 12C]
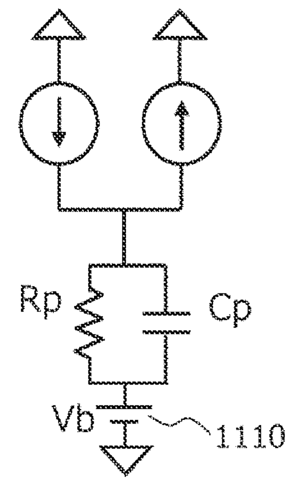

[FIG. 13]

| INITIAL CHARGING AMOUNT Qb | PULSE CONDITION | SECONDARY ELECTRON SIGNAL AMOUNT |
|---|---|---|
| Qb1 | IT1 | Sb(Qb1, IT1) |
| | IT2 | Sb(Qb1, IT2) |
| | IT3 | Sb(Qb1, IT3) |
| Qb2 | IT1 | Sb(Qb2, IT1) |
| | IT2 | Sb(Qb2, IT2) |
| | IT3 | Sb(Qb2, IT3) |
| Qb3 | IT1 | Sb(Qb3, IT1) |
| | IT2 | Sb(Qb3, IT2) |
| | IT3 | Sb(Qb3, IT3) |

⋮

INSPECTION SYSTEM

TECHNICAL FIELD

The present invention relates to an inspection system for estimating electric characteristics of a sample using a charged particle beam.

BACKGROUND ART

As one of sample analysis methods using an electron microscope, there is known a method of forming a voltage contrast image based on detection of secondary electrons or the like obtained by irradiating a sample with an electron beam, and evaluating electric characteristics of an element formed on the sample based on analysis of the voltage contrast image.

PTL 1 discloses a method of determining a defect by calculating an electric resistance value from a voltage contrast. PTL 2 discloses a method of determining a defect by calculating a capacitance value using a voltage contrast transient response corresponding to an irradiation interval of a pulsed electron beam.

CITATION LIST

Patent Literature

PTL 1: JP2003-100623A
PTL 2: JP2016-100153A
PTL 3: JPH11-111599A
PTL 4: JP2013-33739A
PTL 5: JP2003-151483A

SUMMARY OF INVENTION

Technical Problem

In an in-line inspection of a semiconductor, a wafer may be locally charged due to a plasma processing or the like during a process. Electric charges trapped in an insulating film on a wafer surface, a material interface, and the like are not easy to be discharged. PTL 2 discloses a method of inspecting a device by using a charging change amount of the device with respect to an interval time of electron beam irradiation and a voltage contrast image generated by the charging, and when the water is initially charged, the initial charging is superimposed on a charging change due to device characteristics, and an inspection accuracy deteriorates or the inspection is impossible. As a technique for measuring charging on a wafer, there is a method of measuring the charging using a surface voltage system as disclosed in PTL 3, and there is a problem that a spatial resolution is insufficient to measure a specific region. In addition, as a technique for controlling charging on a wafer, there is a method using a charging control electrode as disclosed in PTL 4, and a technique for stabilizing a surface voltage by irradiating a wafer with ultraviolet light as disclosed in PTL 5, and there is a problem that there is no method for evaluating whether the charging on a wafer is properly eliminated.

The invention is made in view of the above problems, and an object of the invention is to provide an inspection system capable of estimating electric characteristics of a sample with high accuracy regardless of an initial charging state of a wafer.

Solution to Problem

An inspection system according to an embodiment of the invention is an inspection system that includes a charged particle beam device and a computer system, and inspects electric characteristics of a sample. A plurality of inspection regions are set in the sample, and respective inspection points are set for a plurality of specific inspection patterns includes in the inspection region. The charged particle beam device includes: a charged particle optical system configured to irradiate the sample with a pulse charged particle beam; a detection system configured to detect secondary charged particles emitted when the sample is irradiated with the pulse charged particle beam, and output a secondary charged particle signal corresponding to an amount of detected secondary charged particles; and a control unit configured to control the charged particle optical system to irradiate the sample with the pulse charged particle beam under a plurality of pulse conditions. The computer system is configured to obtain determination data indicating a secondary charged particle signal from the inspection pattern included in the inspection region corresponding to the plurality of pulse conditions based on measurement data indicating a secondary charged particle signal from the inspection pattern corresponding to the plurality of pulse conditions, the measurement data being obtained by irradiating the inspection pattern with the pulse charged particle beam under the plurality of pulse conditions for each of the plurality of inspection points included in the inspection region, and instruct the control unit to execute a static elimination sequence for eliminating charging from the inspection region when an error between the determination data and reference data is equal to or greater than a predetermined threshold. The reference data is data indicating the secondary charged particle signal from a reference pattern corresponding to the plurality of pulse conditions, the reference data being obtained by irradiating the reference pattern with the pulse charged particle beam under the plurality of pulse conditions. The reference pattern is a pattern that has the same electric characteristics as the inspection pattern and in which initial charging caused by electric charges that are not emitted according to a discharge time constant of the sample is negligible.

Advantageous Effects of Invention

The invention provides an inspection system capable of estimating electric characteristics of a sample with high accuracy regardless of an initial charging state of a wafer.

Other problems and novel features will be apparent from the description of the present description and the accompanying drawings.

BRIEF DESCRIPTION OF DRAWINGS

FIG. 1 is a diagram illustrating a configuration example of an inspection system.

FIG. 2A is a diagram illustrating a transient response of sample charging.

FIG. 2B is a diagram illustrating a transient response of sample charging.

FIG. 3A is a diagram illustrating a change in a secondary electron signal amount when a cut-off time (interval time) of an electron beam is changed.

FIG. 3B is a diagram illustrating a change in a secondary electron signal amount when a charging time of an electron beam is changed.

FIG. 4 is a diagram illustrating a difference in as image of an inspection region obtained depending on the presence or absence of initial charging.

FIG. 5 is a flowchart according to Embodiment 1.

FIG. 6 is an example of inspection data obtained by a flow according to Embodiment 1.

FIG. 7A is a diagram illustrating a static elimination sequence.

FIG. 7B is a diagram illustrating a static elimination sequence.

FIG. 7C is a diagram illustrating a static elimination sequence.

FIG. 7D is a diagram illustrating a static elimination sequence.

FIG. 8 is an example of a user interface for setting a static elimination sequence.

FIG. 9 is an example of a user interface for confirming an initial charging state of ac inspection region.

FIG. 10 is a flowchart according to Embodiment 2.

FIG. 11A is a diagram illustrating a reference model.

FIG. 11B is a diagram illustrating the reference model.

FIG. 12A is a diagram illustrating a charging model.

FIG. 12B is a diagram illustrating the charging model.

FIG. 12C is a diagram illustrating the charging model.

FIG. 13 is an example of an initial charging database.

DESCRIPTION OF EMBODIMENTS

FIG. 1 illustrates a configuration example of an inspection system. An electron microscope body 100 includes, as a main configuration thereof, a light irradiation system for irradiating a sample with light, in addition to elements constituting a general electron microscope such as an electron optical system, a stage mechanism system, a control system, and a detection system.

The electron optical system includes an electron gun 101 serving as a charged particle source, a blanker 102, an aperture 103, a deflector 104, and an objective lens 105. Electrons emitted from the electron gun 101 are pulsed by the blanker 102 and the aperture 103, and focused on a sample 106 by the objective lens 105. The sample 106 is two-dimensionally scanned with a pulsed electron beam by the deflector 104.

The stage mechanism system includes a stage 107 movable along X, Y, and Z axes and a sample stage 108 on the stage 107, and the sample 106 is placed on the sample stage 108. Although not illustrated, a retarding power supply for applying a voltage to the sample 106 may be connected. A calibration sample stage 121 is provided on the stage 107, and a calibration sample 120 is placed on the calibration sample stage 121.

The light irradiation system includes a power supply 109, an optical path breaker 110, and an optical path 111. Continuous light or pulsed light emitted from the power supply 109 is gated by the optical path breaker 110 to control irradiation of the sample 106. Light from the power supply 109 is focused on the sample 106 by the optical path 111. The optical path 111 may include a general optical element such as a mirror, a lens, and a splitter, an optical fiber, and the like.

A control unit 112 is connected to the electron optical system to control an acceleration voltage and an irradiation current of the electron beam and control a deflection position, and is connected to the light irradiation system to control a wavelength and an intensity of the light and control a focal position. In addition, the control unit 112 is connected to the blanker 102, the optical path breaker 110, and a detector 113, and performs control to synchronize a pulse timing of the electron beam, an ON/OFF timing of the light, and a sampling timing of secondary electrons.

A calculation device 114 performs image generation, defect classification, electric characteristic measurement, and the like based on a secondary electron signal acquired by the detector 113, and outputs results to an input and output device 115. The input and output device 115 is implemented by a display, a keyboard, a mouse, control panel-shaped switches, and the like. In addition, the calculation device 114 instructs the control unit 112 to cause the electron microscope body 100 to execute processing. The calculation device 114 may be a single information processing device, or may be connected to another calculation device 131 and a data storage 132 via a network 130 to distribute a calculation load. Processing of the calculation device 114 in Embodiments 1 and 2 to be described later may be executed by the calculation device 114 or may be executed by a calculation device connected to the calculation device 114, and various data may be stored in a storage device of the calculation device 114 or may be stored in the external data storage 132. A single calculation device and a plurality of calculation devices capable of distributing and executing a calculation load are collectively referred to as a computer system.

When the sample is a semiconductor wafer, a charged Particle beam device may include a wafer transfer system. In this case, a wafer cassette 116 on which a wafer is placed, a wafer loader 117 that introduces the wafer into the electron microscope, a preparation chamber 118 in which the wafer is placed before the wafer is introduced into a sample chamber 119, and the like are provided.

A transient response of sample charging due to electron beam irradiation will be described with reference to FIGS. 2A and 2B. When the electron microscope applies a constant acceleration voltage to an electron beam and irradiates the sample with the electron beam, secondary electrons are emitted from the sample. A secondary electron image is formed by detecting the emitted secondary electrons with a detector and synchronizing the detection with performing scanning with the electron beam. An amount of secondary electrons emitted from the sample changes due to a current and an acceleration voltage of an electron beam incident on the sample, a material and a concave-convex structure of a sample surface, or charging of the surface. Depending on the acceleration voltage, a positively charged state in which the amount of secondary electrons emitted from the sample is greater than the number of incident electrons or a negatively charged state in which the amount of emitted secondary electrons is less than the number of incident electrons occurs. In the following description, an example of a state in which positive charging occurs due to irradiation with an electron beam will be described, and the same applies in a state in which negative charging occurs except that a change in a surface voltage of the sample is different.

FIG. 2A is a cross-sectional view of an example of the sample 106. An insulating film 202 is formed on a substrate 201, and a floating conductor 203 is formed thereon. The insulating film 202 is, for example, $SiO_2$ or $Si_3N_4$. At this time, an equivalent resistance R and an equivalent capacitance C are provided between the floating conductor 203 and the substrate 201 as illustrated in the figure.

FIG. 2B illustrates a change in a surface voltage of the floating conductor 203 when the sample in FIG. 2A is irradiated with a pulsed electron beam. When an incident electron beam causes positive charging, the surface voltage of the sample increases during a pulsed electron beam irradiation period, while the surface voltage of the sample decreases during a cut-off period of the pulsed electron beam due to a current flowing to a wafer substrate according to a discharge time constant determined by a product of the equivalent resistance R and the equivalent capacitance C described above. In addition, when the surface voltage of the sample increases, an electric field directly above the sample changes and a voltage harrier is generated, so that the secondary electrons with low energy among the secondary electrons once emitted from the sample are returned to the sample again. Therefore, as the surface voltage increases, a secondary electron signal amount detected by the detector decreases, and as the surface voltage decreases, the secondary electron signal amount detected by the detector increases. A contrast generated in an image due to such a change in the surface voltage is called a voltage contrast. It is possible to indirectly capture a change in the charging on the sample by the voltage contrast.

An influence on the inspection when there is initial charging on the wafer will be described with reference to FIG. 3A. FIG. 3A illustrates changes in the secondary electron signal amount when an electron beam cut-off time (interval time) IT is changed. When there is no initial charging on the sample, a ratio of the secondary electron signal amount to primary irradiated electrons takes a value determined by a sample shape and material characteristics. This is defined as a true secondary electron signal amount S0. When the irradiation of a primary electron beam is continued from this point and an electron beam irradiation condition is a positive charging condition, the secondary electron signal decreases due to the increase in a charging amount as an electron beam irradiation time elapses. When the irradiation is continued further, a progress of charging stops when a primary electron beam irradiation amount and the amount of secondary electrons emitted from the sample match with each other, and the secondary electron signal amount thereafter becomes constant (saturated state). This value is Sinf in the figure. After the certain cut-off time IT elapsed from the saturated state, the electron beam is emitted again. Since the electron beam is not injected during an electron beam cut-off period, the surface voltage of the sample decreases according to the discharge time constant determined by the product of the equivalent resistance R and the equivalent capacitance C. In FIG. 3A, a timing (sampling timing) for detecting the amount of emitted secondary electrons is indicated by a black circle, and in the example of FIG. 3A, the sampling timing is set as a timing immediately after the start of irradiation of the primary electron beam.

Here, when the electron beam is emitted again after a cut-off time IT1, which is sufficiently short with respect to the discharge time constant of the sample, sample electric charges are not completely discharged and the charging remains, and thus a secondary electron signal amount S(IT1) is a value smaller than the true secondary electron signal amount S0. When a secondary electron signal amount S(IT2) and a secondary electron signal amount S(IT3) (where IT1<IT2<IT3) are acquired by extending the cut-off time, a discharge amount increases as the cut-off time increases. Through the above measurements, a cut-off time response curve 301 of the secondary electron signal is obtained. Since an absolute value and a change rate ΔS of the cut-off time response curve 301 reflect values of the equivalent resistance R and the equivalent capacitance C, which are the electric characteristics of the sample, the electric characteristics of the sample can be indirectly estimated by analyzing this curve.

On the other hand, electric charges trapped in the insulating film on the sample surface, a material interface, and the like are not emitted according to the discharge time constant of the sample. In this way, when there is initial charging that is not easy to be discharged in a normal stationary state, the charging is already present when the sample starts to be irradiated with the primary electron beam, and thus a secondary electron signal S0 is smaller than the true secondary electron signal amount S0. In addition, even after a sufficient cut-off time (several tens of microseconds) is set, the secondary electron signal amount does not return to the true secondary electron signal amount S0, and remains at the secondary electron signal amount S0'. As a result, a cut-off time response curve 302 of the secondary electron signal with initial charging exhibits a shape different from that of the cut-off time response curve 302 without initial charging. Therefore, when the electric characteristics of the sample are estimated or defects are determined using the cut-off time response curve, a value of a determination result may differ depending on the presence or absence and a degree of initial charging.

A change in the secondary electron signal amount may be acquired based on a signal waveform from the detector 113 when a specific inspection region is irradiated with an electron beam, or may be acquired based on a brightness of the image. When acquiring the change in the secondary electron signal amount based on the brightness of the image, an image processing executed by the calculation device 114 is also included in processing of the detection system. FIG. 4 illustrates images 411 (schematic diagram) of an inspection region included in a region 401 without initial charging and images 412 (schematic diagram) of an inspection region included in a region 402 with initial charging for a wafer 400 to be inspected. Circle marks arranged in 5×5 and included in the images 411 and the images 412 are images of an inspection pattern. In addition, four images obtained by similarly changing the cut-off time are shown as the images 411 and the images 412, respectively.

In the case without initial charging, a brightness of the inspection pattern increases as the cut-off time increases, whereas in the case with initial charging, even when the cut-off time increases, an amount of increase in the brightness of the inspection pattern is small. A cut-off time response curve 421 (without initial charging) and a cut-off time response curve 422 (with initial charging) can be obtained by plotting the secondary electron signal as the brightness of the inspection pattern in correspondence with the cut-off time.

In order to simplify the explanation, an example in which the pulsed electron beam Irradiation time is such that the charging is saturated and the sample charging is saturated at a start timing of the cut-off time is shown, and even when the cut-off time is started from a state before the sample charging is saturated, the same argument holds if the sample charging state is always at the same level at the start timing of the cut-off time. In addition, in order to simplify the explanation, an example in which a sampling timing of the secondary electron signal is set as immediately after the primary electron beam irradiation, that is, immediately after the cut-off time is shown, and even when a certain delay time is set from the end of the cut-off time to the sampling timing, the same argument holds.

Hereinafter, an example will be described based on an example of obtaining a response curve by changing the cut-off time (IT) illustrated in FIG. 3A, and the response curve for estimating the electric characteristics of the sample is not limited to the cut-off time response curve. FIG. 3B illustrates an example of obtaining a response curve by changing a charging time (CT). The charging time can be defined as a time from the start of primary electron beam irradiation to a sampling timing of the detection system. A charging time response curve 311 and a charging time response curve 312 are similarly obtained by changing the charging time. The cut-off time response curve is a response curve obtained by controlling a discharge time of the sample charging, whereas the charging time response curve is a response curve obtained by controlling a charging time of the sample charging. In either case, information on the electric characteristics of the sample is acquired as well.

Embodiment 1

FIG. 5 is a flowchart in Embodiment 1 for evaluating and eliminating initial charging performed by the calculation device 114 in the inspection system illustrated in FIG. 1.

First, for a reference pattern in the wafer 106 or a reference pattern on the calibration sample 120 on the calibration sample stage 121, secondary electron signals under a plurality of pulse conditions (for example, cut-off time ITi, i is an integer) are acquired and set as reference data $S_r$(ITi) (S501). Primary electron beam irradiation conditions (acceleration voltage, probe current amount, and the like) other than the pulse conditions are the same as conditions used for inspection of an inspection pattern. Here, the reference pattern is a pattern having the same electric characteristics as the inspection pattern. Therefore, the reference pattern has the same surface structure as the inspection pattern, but cross-sectional structures may be different from each other as long as a difference in electric characteristics is negligible. An inspection pattern on the wafer from which the initial charging is eliminated by a static elimination method to be described later may be used as a reference pattern, or a chip cut out from another wafer and from which initial charging as discharged may be used as the calibration sample 120, and an inspection pattern on the calibration sample 120 may be used as a reference pattern. Even when the initial charging is not completely eliminated, an initial charging amount should be reduced to a negligible level. The reference data $S_r$(ITi) is data indicating the secondary electron signals from the reference pattern corresponding to the plurality of pulse conditions. When the reference data $S_r$(ITi) is plotted with the cut-off time IT, the cut-off time response curve 301 is obtained.

Next, an inspection region within the wafer 106 is moved to (S502), and secondary electron signals under the same plurality of pulse conditions as the reference pattern are acquired for the inspection pattern at each inspection point within the inspection region (S503). Here, the secondary electron signals acquired under pulse irradiation conditions ITi in inspection patterns p (where p is an integer representing inspection points) in an inspection region are assumed to be measurement data S(p, ITi). The measurement data S(p, ITi) is data representing the secondary electron signals from the inspection pattern at an inspection point p corresponding to the plurality of pulse conditions. Values of the secondary electron signals S(1, ITi), S(2, ITi), and so on acquired in the inspection patterns p (p=1, 2, and so on) in the inspection region are averaged to obtain determination data $S_m$(ITi) (S504). The determination data $S_m$(ITi) is a representative value of the measurement data acquired for the inspection patterns p within the inspection region, and a calculation method is not limited to averaging.

Next, an initial charging error E (hereinafter referred to as an error) between the reference data $S_r$(ITi) and the determination data $S_m$(ITi) obtained for each inspection region is calculated (S505). As an example of an error calculation method, a square error as shown below can be used.

$$B = \sum (S_r(ITi) - S_m(ITi))^2 \quad \text{[Equation 1]}$$

It is assumed that the smaller a value of the error E, the higher a similarity between the cut-off time response curve $S_r$ and the cut-off time response curve $S_m$ for the cut-off time ITi. The error calculation method is not limited to (Equation 1), and (Equation 2) using a difference between the maximum value and the minimum value of secondary electron signal amounts can also be used.

$$E = |\Delta S_r - \Delta S_m|$$

$$\Delta S_r = S_r(\mathrm{IT}_{max}) - S_r(\mathrm{IT}_{max})$$

$$\Delta S_m = S_m(\mathrm{IT}_{max}) - S_m(\mathrm{IT}_{min}) \quad \text{[Equation 2]}$$

Here, $\mathrm{IT}_{max}$ and $\mathrm{IT}_{min}$ are the maximum value and the minimum value of the cut-off time ITi that can be taken, respectively. Since the cut-off time response curve is a monotonically increasing function, it is also possible to determine that the smaller the value of the error E, the higher the similarity between the reference data $S_r$ and the determination data $S_m$ by such a calculation method.

In step S506, it is determined whether the error H is equal to or less than a predetermined threshold, and when the error H exceeds the threshold, the control unit 112 executes a static elimination sequence. When the threshold is excessively small, the number of times of execution of the static elimination sequence increases, which is a factor in reducing an inspection throughput, and thus the threshold is determined in accordance with a degree or electric characteristic failures to be detected in the inspection.

In the static elimination sequence, it is confirmed in advance that the number of times of execution of the static elimination sequence does not exceed a specified maximum value (S507), and if the number of times or execution is within the specified value, the static elimination sequence is executed (S508). After the static elimination sequence, the process moves to step S503 to acquire the secondary electron signal of the same inspection region, and is repeated until the error E is within the threshold in step S506. When the error E is equal to or less than the threshold, or when the number of times of execution of static elimination exceeds the specified maximum value, a measurement result is recorded, and the irradiation of the inspection region with the electron beam is terminated (S509). When there is still an uninspected inspection region left (No in S510), the next inspection region is moved to (S502), and the subsequent steps are repeatedly executed. When the irradiation of all inspection regions with the electron beam and the acquisition of the secondary electron signal are completed (Yes in S510), the electric characteristics are estimated for each inspection point based on secondary electron signal data (measurement data) that depends on the pulse condition (here, cut-off time IT) (S511).

The electric characteristics can be estimated by the calculation device 114, for example, by referring to a database in which cut-off time response characteristics, corresponding electric characteristic values (equivalent resistance R, equivalent capacitance C, and the like), and defect classifications are stored in association with each other. The cut-off time response characteristics may be a cut-off time response curve obtained by actual measurement or a cut-off time response curve obtained by simulation. At this time, an electric characteristic estimation error is output for the inspection points in which the error E exceeds the threshold.

FIG. 6 is an example of inspection data obtained by a flow of FIG. 5. Region numbers such as G1 and G2 are assigned to respective inspection regions, and inspection point numbers such as P1 and P2 are assigned to inspection points within the inspection region. Further, the plurality of pulse conditions (here, cut-off time) executed at each inspection point number and secondary electron signals measured under the pulse conditions are stored in association with each other. An electric characteristic index (here, equivalent resistance R and equivalent capacitance C) estimated from the measurement data S for each inspection point is stored for each inspection point. In addition, the initial charging error and the number of times of execution of static elimination calculated for each inspection region are also stored. When the error E does not fall within the threshold even after the static elimination sequence is executed a specified maximum number of times, a failure to eliminate the initial charging is recorded as an initial charging determination, and an error is output to the electric characteristic index (for inspection region G2).

FIG. 6 illustrates an example in which only the measurement data after the static elimination of the initial charging is stored, and all the measurement data before and after the static elimination sequence may be stored. Alternatively, the electric characteristic index may be estimated based on the measurement data before static elimination, and stored together with the value of the error E at that time. By storing the value of the error E, it is possible to determine a validity of an estimated value of the electric characteristic index.

As described above, in the flow of FIG. 5, a charging state of the inspection region is evaluated based on the reference data obtained based on the reference pattern without initial charging, and when it is recognized that there is initial charging that is not negligible in the inspection region, the static elimination sequence for eliminating the initial charging is executed. Depending on the presence or absence of initial charging, a deviation occurs as in the cut-off time response curve 421 and the cut-off time response curve 422 illustrated in FIG. 4. In the static elimination sequence, charging on the sample surface is eliminated by exciting fixed electric charges in the sample. Therefore, the deviation between the cut-off time response curve 421 and the cut-off time response curve 422 is reduced. When a static elimination amount in one static elimination sequence is insufficient, the static elimination sequence is repeated to adjust a charging amount within an allowable range.

The static elimination sequence will be described with reference to FIGS. 7A to 7D. Inspection patterns 701 are, for example, electrodes, and inspection point numbers are assigned to the twenty five inspection patterns 701 included in an inspection region 702. FIG. 7A is an example of irradiating a light irradiation region 703 including the inspection region 702 with static elimination light such as ultraviolet light. This example is used to eliminate initial charging captured at an interface of the insulating film in the inspection region or an interface such as a PG junction.

FIG. 7B is an example of irradiating, with static elimination light, the light irradiation region 703 including related patterns 704 in a region different from the inspection region 702 including the inspection patterns 701. This example is effective for inspection of a device having a structure as illustrated in FIG. 7C, for example. The device in FIG. 7C has a MOS structure including a diffusion layer 707, an insulating film 708, and a gate electrode 709 formed on a substrate 706. The electrodes (inspection patterns) 701, which are inspection patterns, are connected to the diffusion layer 707, and the related electrode (related pattern) 704 is connected to the gate electrode 709. When the gate electrode 709 is initially charged, an amount of current flowing directly under a gate from the diffusion layer 707 is a value different from, that when the gate electrode 709 is not initially charged, and a resistance value estimated by the inspection varies with respect to the electrodes 701. Therefore, by irradiating the related electrodes (related patterns) 704 with static elimination light and initializing the initial charging of the gate electrode 709 to a constant state by light irradiation, it is possible to reduce an estimation error caused by a gate voltage.

FIG. 7D illustrates an example of irradiating, with an electron beam, the inspection region 702 and a charging control region 710 that includes the inspection region 702 and is wider than the inspection region 702. It is utilized that stronger charging is generated by widening an electron beam irradiation region depending on the acceleration voltage and an amount of irradiated electron beam. In this example, a wide region is irradiated with an electron beam to generate charging having a high intensity, and the resulting electric field is used to reset electric charges trapped inside the inspection region 702. An acceleration voltage and a current value of a primary electron beam with which the charging control region 710 is scanned may be set to values different from an acceleration voltage and a current value of a primary electron beam with which an inspection region is scanned at the time of inspection.

FIG. 8 illustrates an example of a user interface for setting a static elimination sequence. In an error calculation method input portion 801, in step S505 of FIG. 5, a method for calculating the initial charging error E between the reference data and the determination data is designated from a plurality of options prepared in advance. An initial charging error threshold input portion 802 receives a threshold for the error E in step S506. A maximum static elimination execution number input portion 803 receives a maximum execution number of the static elimination sequence in step S507. A static elimination sequence setting input portion 804 designates an execution order of one or more operations in the static elimination sequence in step S508. Operation conditions for each operation are designated by an operation condition designation portion 805.

FIG. 8 illustrates an example in which electron beam irradiation is set first and light irradiation is set second. An operation condition designation portion 805*a* displays items for setting conditions at the time of electron beam irradiation, and includes a mode designation portion 806, an acceleration voltage designation portion 807, a probe current designation portion 808, a magnification designation portion 809, a frame number designation portion 810, and the like. The number of frames indicates the number of times of scanning the charging control region 710 with the electron beam. In addition, as illustrated in FIG. 7D, when the electron beam is emitted to a wide range at the time of static elimination, is implemented by adjusting a value of the magnification designation portion 809. An operation condition designation portion 805*b* displays items for setting conditions at the time of light irradiation, and includes the mode designation portion 806, a wavelength designation portion 813, an intensity designation portion 814, an irradiation time designation portion 815, an irradiation relative coordinate input portion 816, and the like. When the inspection region is irradiated with the static elimination light as illustrated in FIG. 7A, it is implemented by inputting X=0 and Y=0 to the irradiation relative coordinate input portion 816, and when the inspection region and a static elimination region are different from each other as illustrated in FIG. 7B, it is implemented by inputting relative coordinates of the static elimination region with respect to the inspection region to the irradiation relative coordinate input portion 816. By selecting the electron beam irradiation, the light irradiation, or the like in the mode designation portion 806, a combination of static elimination operations set in the static elimination sequence setting input portion 804 and whether to execute the static elimination operations are determined.

FIG. 9 is an example of a user interface for confirming an initial charging state of an inspection region. An initial charging distribution display portion 901 displays the values of the initial charging error F calculated in each inspection region within the wafer or within a section as a color map, and an initial charging state within the wafer or within the section is visualized. An initial charging state display portion 902 displays a measured secondary electron signal amount (brightness) in a specific inspection region selected from the initial charging distribution display portion 901, and displays the secondary electron signal amount (brightness) so as to be compared with a reference value. Brightness values before and after the static elimination sequence are displayed, and it can be confirmed how close the reference value is by the static elimination sequence. It is also used for confirmation when an unexpected behavior is shown in repetition of the static elimination sequence.

Embodiment 2

FIG. 10 is a flowchart in Embodiment 2 in which electric characteristics are inspected using an initial charging measurement result, which is executed by the calculation device 114 in the inspection system illustrated in FIG. 1.

First, secondary electron signals are acquired under a plurality of pulse conditions for a reference pattern and used as reference data (S1001). The processing in step S1001 is the same as the processing in step S501 of Embodiment 1. Next, electric characteristic parameters (resistance R, capacitance C, and the like) of an equivalent circuit netlist are adjusted such that a simulation result using an equivalent circuit netlist expressing charging of the reference pattern and the reference data match with each other, and the equivalent circuit netlist and the adjusted electric characteristic parameter set are used as a reference model (S1002). Next, a charging model is created by adding a voltage source or a charged capacitive element to the reference model as an element expressing initial charging. A simulation is performed using an initial charging voltage of the charging model as a parameter, cut-off time response characteristics of a secondary electron signal amount with respect to an initial charging amount are created and stored as a database, and the database is used as an initial charging database (S1003).

Next, an inspection region within the wafer 106 is moved to (S1004), and secondary electron signal amounts under the same plurality of pulse conditions as the reference pattern are acquired for an inspection pattern within the inspection region (S1005). Values (measurement data) of the secondary electron signal amount S acquired in the inspection pattern in the inspection region are averaged to obtain determination data $S_m$ (S1006). The processing of steps S1004 to S1006 is the same as the processing of steps S502 to S504 of Embodiment 1.

Next, the determination data $S_m$ is compared with the initial charging database to acquire the initial charging amount, and the acquired initial charging amount is reflected in an equivalent circuit netlist representing the charging of the inspection pattern to be used as an inspection model (S1007). Next, a simulation is performed using the electric characteristic parameters (resistance R, capacitance C, and the like) in the inspection model as variables (S100A), and the electric characteristic parameters in which the measurement data at an inspection point most matches with a simulation result are set as estimated values of electric characteristic values of the inspection pattern at the inspection point (S1009). This is repeated for all inspection regions (S1010), and the inspection ends when acquisition of secondary electron signal amounts and estimation of electric characteristics for all inspection regions are completed.

The reference model will be described with reference to FIGS. 11A and 11B. In a device illustrated in FIG. 11A, an electrode 1103 is formed on a substrate 1101 with an insulating film 1102 interposed therebetween. At this time, it can be considered that there is a resistor 1104 and a capacitor 1105 representing leakage current when the electrode 1103 is charged, which can be represented by a model illustrated in FIG. 11B. A pulsed electron beam model 1106 and a secondary electron emission model 1107 are connected to the resistor 1104 and the capacitor 1105 that are connected in parallel. The pulsed electron beam model 1106 represents an amount of electric charges incident on a sample from a primary electron beam under the set pulse conditions for irradiating the sample (primary electron beam irradiation conditions including cut-off time). The secondary electron emission model 1107 represents an amount of electric charges emitted from the sample depending on a surface voltage. A simulation is performed by setting the plurality of pulse conditions for irradiating the wafer in the pulsed electron beam model 1106, and the reference model is obtained by defining a value of the resistor 1104 and a value of the capacitor 1105 as Rp and Cp, respectively, such that the reference data and a simulation result match with each other in the equivalent circuit netlist.

On the other hand, FIG. 12A illustrates a state in which initial charging electric charges 1108 are trapped at an interface between the electrode 1103 and the insulating film 1102 in the deice illustrated in FIG. 11A. FIGS. 12B and 12C illustrate a charging model reflecting the state. FIG. 12B illustrates a model in which a capacitor Cb is added between an insulating film capacitor 1005 and the electrode 1103 of the reference model, and initial charging is expressed as electric charges Qb sandwiched between the capacitor Cb and a capacitor Cp. FIG. 12C illustrates a model in which a voltage source 1110 is added to the reference model, and initial charging simulated by applying, a bias voltage to a substrate. This is a charging model, and in step S1003, the secondary electron signal amount is simulated using the Qb or a bias voltage Vb in the charging model as a variable, and a result thereof is stored as an initial charging database.

FIG. 13 illustrates an example of an initial charging database, created using the charging model in FIG. 12B. Secondary electron signals (brightness) when pulse conditions are IT1, IT2, IT3, and so on with respect to initial charging amounts Qb1, Qb2, and so on are stored in association with each other as Sb (Qb1, IT1), S (Qb1, IT2), and so on.

In step S1007, the initial charging amount Qb of the inspection region is estimated by selecting the initial charging amount Qb closest to the determination data from among the initial charging amounts Qb1, Qb2, and so on. When a value of the initial charging amount Qb of the inspection region is determined, an inspection model in which an element representing an initial charging amount is added to the equivalent circuit netlist representing the charging of the inspection pattern is simulated using the equivalent resistance R and the equivalent capacitance C as variables, and when compared with the secondary electron signal amount acquired for each inspection point, the resistance R and the capacitance C that give the closest secondary electron signal can be acquired as the resistance and capacitance of the inspection pattern at the inspection point.

As described above, in Embodiment 2, the initial charging amount is estimated under the plurality of pulse conditions, and the electric characteristic value at each inspection point is simulated in consideration of the influence of the initial charging, whereby it is possible to estimate the electric characteristics regardless of the initial charging amount at the time of measurement.

REFERENCE SIGNS LIST

100: electron microscope body
101: electron gun (charged particle source)
102: blanker
103: aperture
104: deflector
105: objective lens
106: sample
107: stage
108: sample stage
109: power supply
110: optical path breaker
111: optical path
112: control unit
113: detector
114, 131: calculation device
115: input and output device
116: wafer cassette
117: wafer loader
118: preparation chamber
119: sample chamber
120: calibration sample
121: calibration sample stage
130: network
132: data storage
201: substrate
202: insulating film
203: floating conductor
301, 302, 421, 422: cut-off time response curve
311, 312: charging time response curve
400: wafer to be inspected
401, 402: region
411, 412: image
701: inspection pattern
702: inspection region
703: light irradiation region
704: related electrode
706: substrate
707: diffusion layer
708: insulating trim
709: gate electrode
710: charging control region
801: error calculation method input portion
802: initial charging error threshold input portion
803: maximum static elimination execution number input portion
804: static elimination sequence setting input portion
805: operation condition designation portion
806: mode designation portion
807: acceleration voltage designation portion
808: probe current designation portion
809: magnification designation portion
810: frame number designation portion.
813: wavelength designation portion
814: intensity designation portion
815: irradiation time designation portion
816: irradiation relative coordinate input portion
901: initial charging distribution display portion
902: initial charging state display portion
1101: substrate
1102: insulating film
1103: electrode
1104: resistor
1105: capacitor
1106: pulsed electron beam model
1107: secondary electron emission model
1108: initial charging electric charge
1110: voltage source

The invention claimed is:

1. An inspection system for inspecting electric characteristics of a sample, the inspection system comprising: a charged particle beam device and a computer system, wherein a plurality of inspection regions are set in the sample, and respective inspection points are set for a plurality of specific inspection patterns included in the inspection region, the charged particle beam device includes a charged particle optical system configured to irradiate the sample with a pulse charged particle beam, a detection system configured to detect secondary charged particles emitted when the sample is irradiated with the pulse charged particle beam, and output a secondary charged particle signal corresponding to an amount of detected secondary charged particles, and a control unit configured to control the charged particle optical system to irradiate the sample with the pulse charged particle beam under a plurality of pulse conditions, the computer system is configured to obtain determination data indicating a secondary charged particle signal from the inspection pattern included in the inspection region corresponding to the plurality of pulse conditions based on measurement data indicating a secondary charged particle signal from the inspection pattern corresponding to the plurality of pulse conditions, the measurement data being obtained by irradiating the inspection pattern with the pulse charged particle beam under the plurality of pulse conditions for each of the plurality of inspection points included in the inspection region, and instruct the control unit to execute a static elimination sequence for eliminating charging of the inspection region when an error between the determination data and reference data is equal to or greater than a predetermined threshold, the reference data being data indicating the secondary charged particle signal from a reference pattern corresponding to the plurality of pulse conditions, the reference data being obtained by irradiating the reference pattern with the pulse charged particle beam under the plurality of pulse conditions, and the reference pattern is a pattern that has the same electric characteristics as the inspection pattern and in which initial charging caused by electric charges that are not emitted according to a discharge time constant of the sample is negligible.

2. The inspection system according to claim 1, wherein the plurality of pulse conditions are conditions in which cut-off times during which the charged particle optical system does not irradiate the sample with the pulse charged particle beam are different, or conditions in which charging times from when the charged particle optical system irradiates the sample with the pulse charged particle beam to a sampling timing of the detection system are different.

3. The inspection system according to claim 1, wherein the charged particle beam device further includes an optical system configured to irradiate the sample with light, and the control unit of the charged particle beam device is configured to receive, from the computer system, an instruction to execute the static elimination sequence, and control the optical system to irradiate a light irradiation region in the inspection region with the light under a predetermined light irradiation condition.

4. The inspection system according to claim 3, wherein the light irradiation region includes at least one of the inspection pattern and a related pattern related to the inspection pattern.

5. The inspection system according to claim 1, wherein the control unit of the charged particle beam device is configured to receive, from the computer system, an instruction to execute the static elimination sequence, and control the charged particle optical system so as to scan a charging control region in the inspection region with a charged particle beam under a predetermined charged particle beam irradiation condition, and the charging control region includes the inspection region.

6. The inspection system according to claim 1, wherein the computer system is configured to output an inspection result of the inspection region as an error when the error between the determination data and the reference data is equal to or greater than the predetermined threshold even when the static elimination sequence is executed a predetermined number of times.

7. The inspection system according to claim 1, wherein the computer system is configured to estimate the electric characteristics of the inspection patterns at the inspection points as an inspection result of the inspection region based on the measurement data for each of the inspection points when the error between the determination data and the reference data is less than the predetermined threshold.

8. The inspection system according to claim 7, wherein the computer system is configured to output the inspection result of the inspection region including the error between the determination data and the reference data when the measurement data used for estimating the electric characteristics of the inspection pattern at the inspection point is acquired.

9. The inspection system according to claim 1, wherein the computer system is configured to calculate the determination data as an average value of the measurement data for each of the inspection points in the inspection region.

* * * * *